US008022973B2

(12) United States Patent
Takeda

(10) Patent No.: US 8,022,973 B2
(45) Date of Patent: Sep. 20, 2011

(54) CASE AND TIME RECORDER

(75) Inventor: Akio Takeda, Chiba (JP)

(73) Assignee: Seiko Precision Inc., Narashino-shi (JP)

( * ) Notice: Subject to any disclaimer, the term of this patent is extended or adjusted under 35 U.S.C. 154(b) by 411 days.

(21) Appl. No.: 12/331,803

(22) Filed: Dec. 10, 2008

(65) Prior Publication Data

US 2009/0097194 A1 Apr. 16, 2009

Related U.S. Application Data

(63) Continuation of application No. PCT/JP2007/061347, filed on Jun. 5, 2007.

(30) Foreign Application Priority Data

Jun. 13, 2006 (JP) ................................ 2006-163162

(51) Int. Cl.
*H05K 5/00* (2006.01)
*B65D 85/38* (2006.01)

(52) U.S. Cl. .................... 347/222; 206/305; 361/679.01

(58) Field of Classification Search .................. 347/222; 361/679.01; 206/305
See application file for complete search history.

(56) References Cited

U.S. PATENT DOCUMENTS 5,790,162 A * 8/1998 Adams et al. ................ 347/222

FOREIGN PATENT DOCUMENTS

| | | |
|---|---|---|
| JP | 59-65585 | 5/1984 |
| JP | 63-175277 | 11/1988 |
| JP | 9-196045 | 7/1997 |
| JP | 11-46073 | 2/1999 |
| JP | 2003-309379 A1 | 10/2003 |

OTHER PUBLICATIONS

Office Action dated Jul. 8, 2010 (Notification of Reasons for Refusal) corresponding to Japan Patent Application No. 2006-163162 with English translation.
Office Action dated Sep. 8, 2010 issued in Chinese Patent Application No. 200780021829.8 with English translation.
International Search Report for International Application No. PCT/JP2007/061347 dated Aug. 2, 2007.

* cited by examiner

*Primary Examiner* — Daniel Petkovsek
(74) *Attorney, Agent, or Firm* — Kratz, Quintos & Hanson, LLP

(57) ABSTRACT

An inward deformation of one side wall of a main body is corrected, since a shaft serving as a rotatable shaft of a door is in contact with ribs of a side wall. Additionally, an inward deformation of another side wall of the main body is corrected, since ribs of a side wall of door are in contact with side wall.

4 Claims, 8 Drawing Sheets

CASE AND TIME RECORDER

CROSS-REFERENCE TO RELATED APPLICATIONS

This application is a continuation of and claims priority to International Application No. PCT/JP2007/061347 filed on Jun. 5, 2007, which claims priority to Japanese Patent Application No. 2006-163162 filed on Jun. 13, 2006, subject matter of these patent documents is incorporated by reference herein in its entirety.

BACKGROUND OF THE INVENTION

1. Field of the Invention

This invention relates to a case made of resin and a time recorder having the same.

2. Description of the Related Art

There has been known an electrical apparatus with a case formed into a bucket shape by injection molding and made of resin. As an example of a time recorder, a case thereof accommodates a print head, a consumable supply such as an ink ribbon, and a transporting mechanism for transporting a time card. When the consumable supply is replaced or the time card is jammed, it is necessary to open the case. For this reason, the case having such a broad opening is employed.

In such a case made of resin, an inward deformation arise as closer to the periphery of the opening from the back thereof, therefore, there is a need for a structure for correcting the inward deformation.

For example, Japanese Patent Application Publication No. 11-46073 (hereinafter referred to as Document 1) discloses a case in which the inward deformation is corrected. Specifically, a cover having a projecting guide is employed in the above case, and the guide is brought into engagement with the opening, so that the opening is spread outward by the guide, whereby the inward deformation is corrected.

Additionally, Japanese Patent Application Publication No. 2003-309379 (hereinafter referred to as Document 2) discloses a case restraining deformation thereof. Specifically, a reinforcing rib is provided in the case so as to cross other two ribs which integrally formed in the case made of resin and which extend toward the back of an opening, thereby restraining the deformation of the case.

However, there is a problem that the case disclosed in Document 1 is not adapted to a case having a door in the opening. In other words, in order to bring the guide into contact with opposing side walls of the case, even if a rotatable shaft is provided near one of the side walls, and a cover, serving as a door which opens and closes in such a direction in alignment with the side walls, is attached to the case, this is impossible due to the interference of the guide with the side wall. Consequently, the case disclosed in Document 1 is unsuitable for a case of the time recorder requiring the door at the opening.

Additionally, there is a problem that the case disclosed in Document 2 increases the number of parts and man-hours because the reinforcing rib is attached to the case.

SUMMARY OF THE INVENTION

It is therefore an object of the present invention to provide a case having a door and a time recorder with the case, so that an inward deformation of the case can be corrected without increasing the number of parts and man-hours.

To achieve the above object, according to a first aspect of the present invention, there is provided a case, made of resin, including a main body with an opening and a door closing the opening, and the case includes: a rib integrally formed at inner side of the main body and extending from the opening to a back of the opening; and a shaft member rotatably supported by a bearing integrally formed in the main body, provided at one side of the opening, and serving as a rotatable shaft of the door, wherein the shaft member is in contact with the rib.

According to a second aspect of the present invention, there is provided a time recorder having a case, made of resin, having a main body with an opening and a door closing the opening, and the time recorder includes: a rib integrally formed at inner side of the main body and extending from the opening to a back of the opening; and a shaft member rotatably supported by a bearing integrally formed in the main body, provided at one side of the opening, and serving as a rotatable shaft of the door, wherein the shaft member is in contact with the rib.

According to the first aspect and second aspect of the present invention, the inward deformation of the case is corrected, because the axial member, serving as a rotatable shaft of the door, and the rib, provided to extend from the opening to the back of the case, are in contact with each other. Therefore, the inward deformation of the case is corrected without increasing the number of parts and man-hours.

BRIEF DESCRIPTION OF THE DRAWINGS

Preferred embodiments of the present invention will be described in detail with reference to the following drawings, wherein.

DESCRIPTION OF THE PREFERRED EMBODIMENTS

A time recorder according to an embodiment of the present invention will now be described, with reference to the accompanying drawings.

Figure 1:
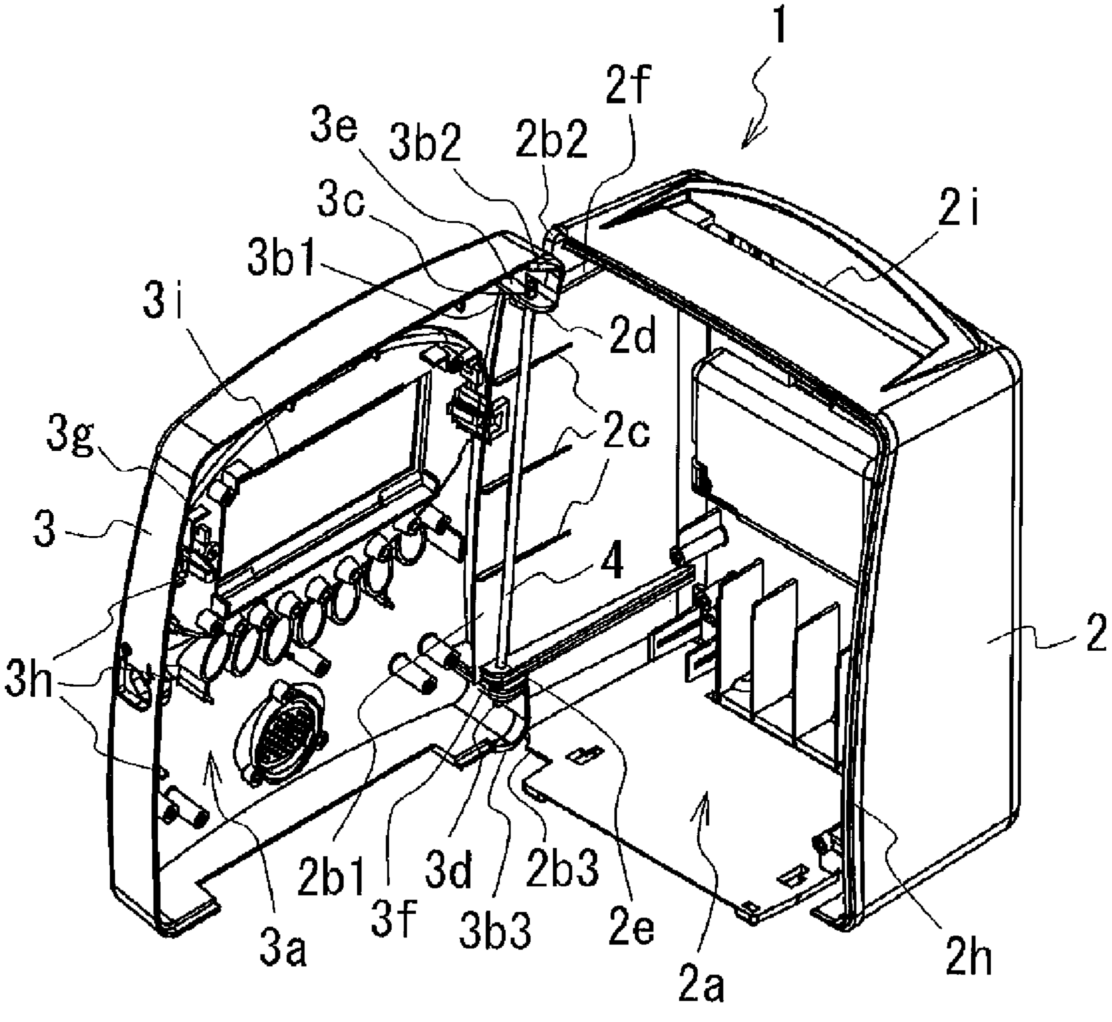
FIG. 1 is a perspective view showing a time recorder in accordance with an embodiment of the present invention.
Figure 2:
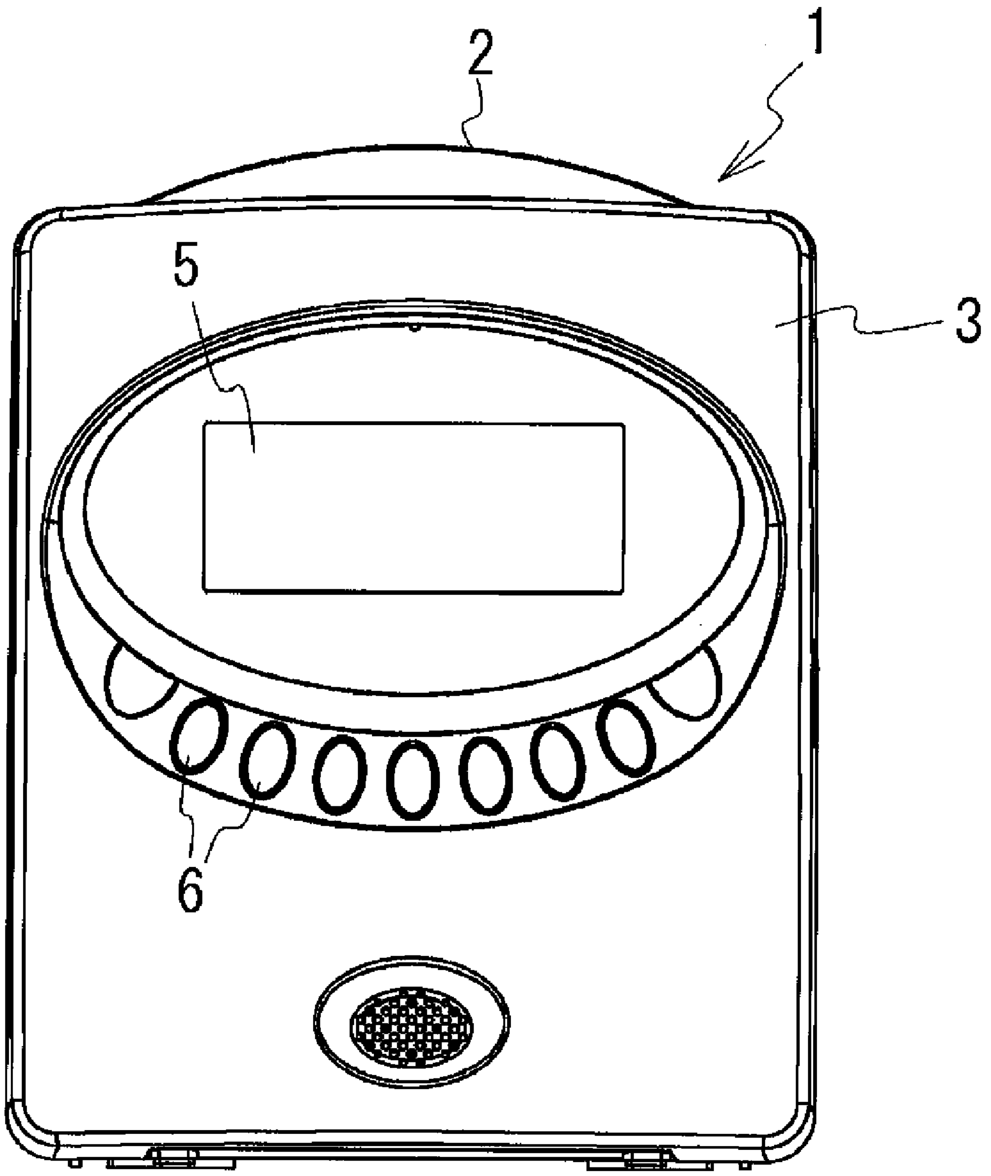
FIG. 2 is a front view showing the time recorder in accordance with an embodiment of the present invention.

The time recorder according to an embodiment of the present invention employs a case 1 shown in FIG. 1. The case 1 includes: a main body 2 formed into a bucket shape by injection molding and made of resin; a door 3 formed in a similar manner by injection molding and made of resin; and a shaft 4 coupling the main body 2 with the door 3. FIG. 2 is a front view showing the time recorder. The time recorder provides the door 3 with a display portion 5 and operation buttons 6.

Figure 3:
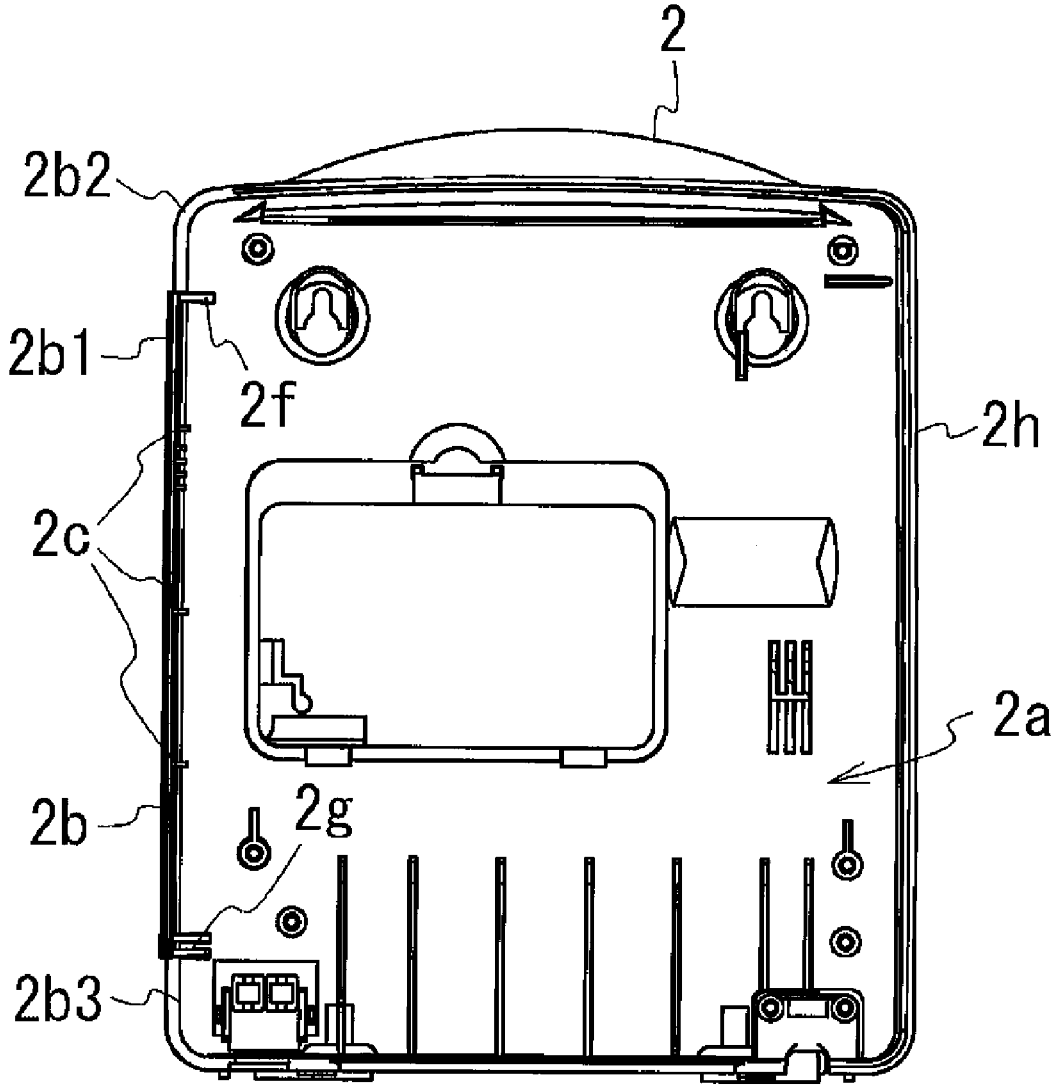
FIG. 3 is a front view showing a main case of the time recorder in accordance with an embodiment of the present invention.

As shown in FIG. 1, the main body 2 is formed into a bucket shape, that is, the main body 2 has an opening 2*a* located at one side (a front side) of substantially rectangular parallelepiped. Further, FIG. 3 shows the main body 2 in a designed state, namely, the inward deformation cannot be seen, when viewed from the front side. The main body 2 accommodates a mechanical apparatus, as will be described below, including a print head and the like. Three ribs 2*c* are integrally formed in the main body 2 at an inner side of a side wall 2*b* at the left-hand side of FIG. 1. The ribs 2*c* extend from the opening 2*a* to the back of the main body 2.

Also, in the side wall 2*b*, bearing portions 2*d* and 2*e* are integrally formed in the main body 2 at a substantially upper end and at a lower end of one side of the opening 2*a*, respectively. The bearing portions 2*d* and 2*e* are respectively provided to penetrate ribs 2*f* and 2*g*, which are integrally formed in the opening 2*a* and extend from the opening 2*a* to the back of the main body 2.

Figure 4:
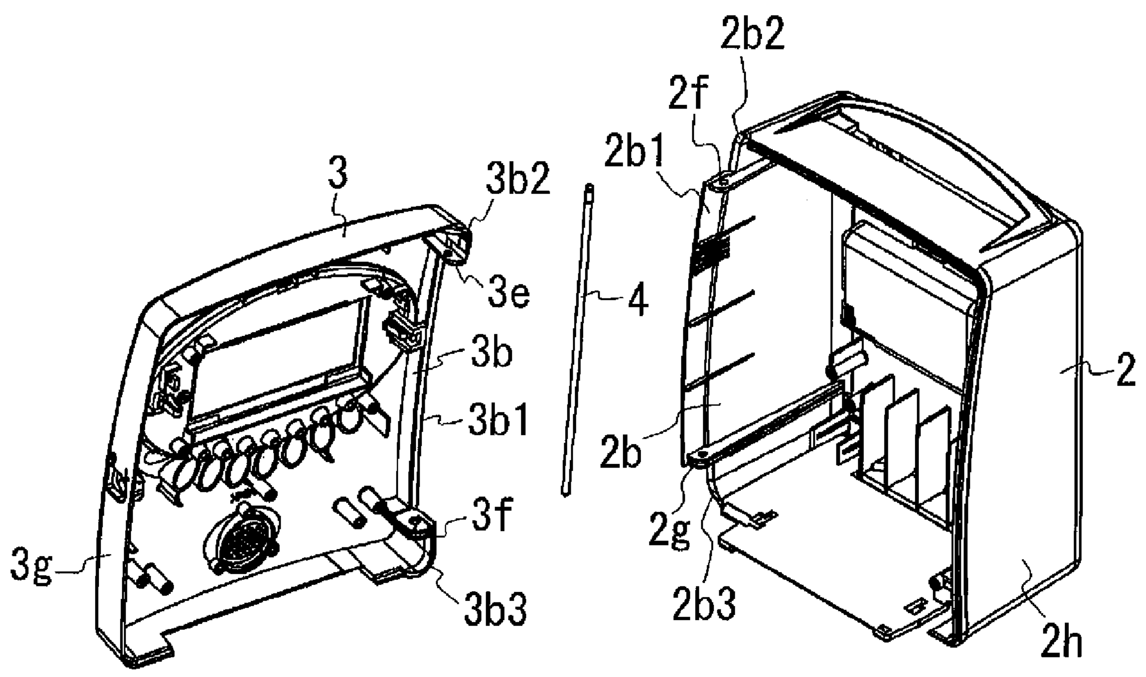
FIG. 4 is an exploded perspective view showing a case of the time recorder in accordance with an embodiment of the present invention.

The side wall 2*b* of the main body 2, at the right-hand side of FIG. 4, has a projection 2*b*1 projecting toward the front side of the time recorder. The projection 2*b*1 is located between the ribs 2*f* and 2*g*.

A slot 2*i* is provided at an upper surface of the main body 2 and for inserting a time card, not shown, into the main body 2.

Figure 5:
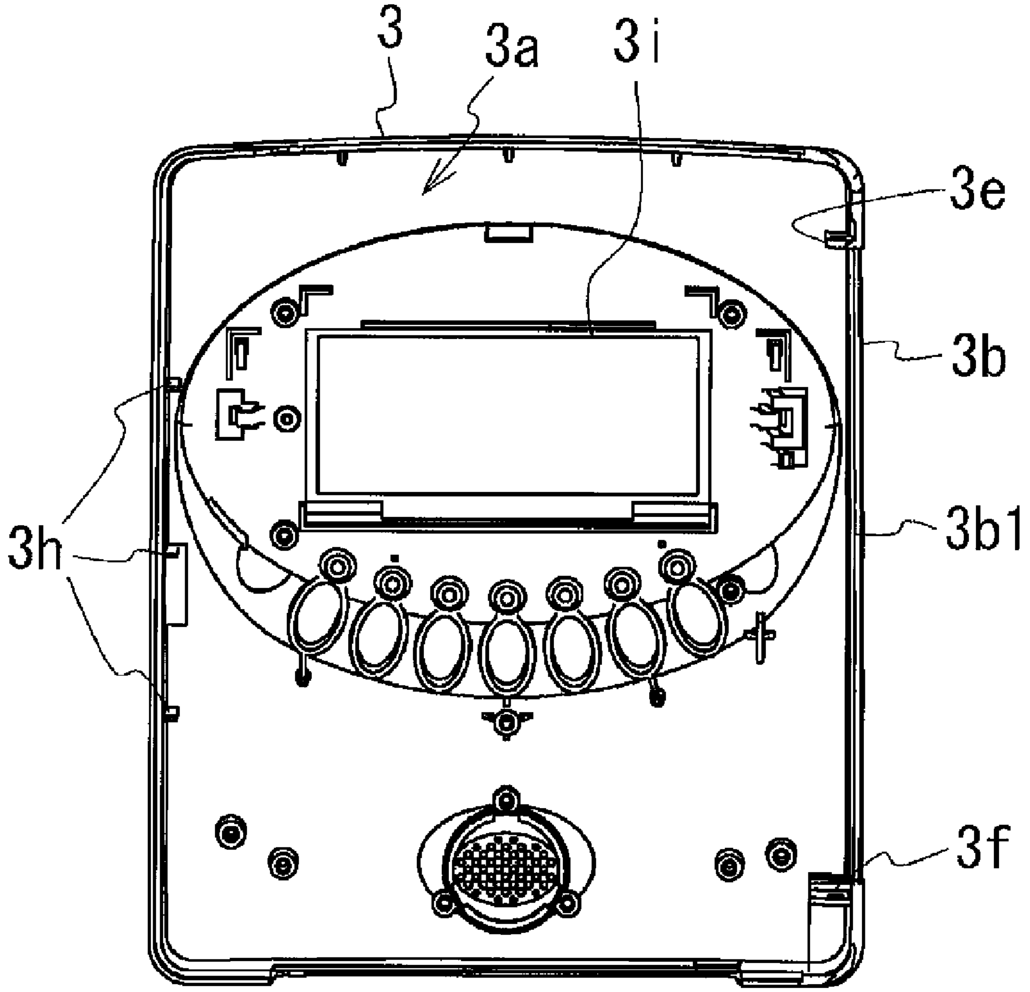
FIG. 5 is a back view showing a door of the time recorder in accordance with an embodiment.

The door 3 is formed into a shallow bucket shape, this is, the door 3 has an opening 3*a* located at one side (a back side) of substantially rectangular parallelepiped. The back side of the opening 3*a* corresponds to the front side of the time recorder. Additionally, FIG. 5 shows the door 3 when viewed from the back side. Also, as to the door 3, there arises no problem of the inward deformation unlike the main body 2. In a side wall 3*b* of the door 3 at the right-hand side of FIG. 1, bearing portions 3*c* and 3*d* are integrally formed in the door 3 at a substantially upper end and at a lower end of the opening 3*a*, respectively. The bearing portions 3*c* and 3*d* are provided to penetrate ribs 3*e* and 3*f* respectively, which are integrally formed in the door 3 and extend from the opening 3*a* to a back of the door 3.

The side wall 3*b* has a cutout portion 3*b*1 arranged between the ribs 3*e* and 3*f* and cut out with respect to the front surface of the time recorder, unlike a side wall 3*g* of the door 3, at the right-hand side of the FIG. 4. When the door 3 is closed, the projection 2*b*1 engages with the cutout portion 3*b*1.

Furthermore, the door 3 has projections 3*b*2 and 3*b*3 which project toward the back side of the time recorder, and which correspond to an upper side of the rib 3*e* and a lower side of the rib 3*f*, respectively. In corresponding to this, receiving portions 2*b*2 and 2*b*3 are provided in the main body 2. As seen from the top of the time recorder, the projections 3*b*2 and 3*b*3 and the receiving portions 2*b*2 and 2*b*3 each have an arc portion about the center of the axis of the shaft 4, the arc portions are engaged with each other.

Also, three ribs 3*h* are integrally formed in the door 3 at the internal side of the side wall 3*g* and extending from the opening 3*a* to the back of the opening 3*a*. The ribs 3*h* are partially projected from the door 3 to the back side of the time recorder.

Moreover, the door 3 has a window 3*i* for exposing the display portion 5.

The shaft 4 is made of a metal such as a stainless steel. This enables the rigidity of the shaft 4 to be higher than that of the side wall 2*b*. First, the door 3 and the main body 2 are located in such a manner that the ribs 3*e* and 3*f* of the door 3 sandwich the ribs 2*f* and 2*g* of the main body 2. Next, the bearing portions 2*d* and 3*c* are aligned and the bearing portions 2*e* and 3*d* are aligned. Then, the shaft 4 is inserted into these bearing portions from the upper face of the time recorder so as to couple the door 3 to the main body 2.

Figure 6:
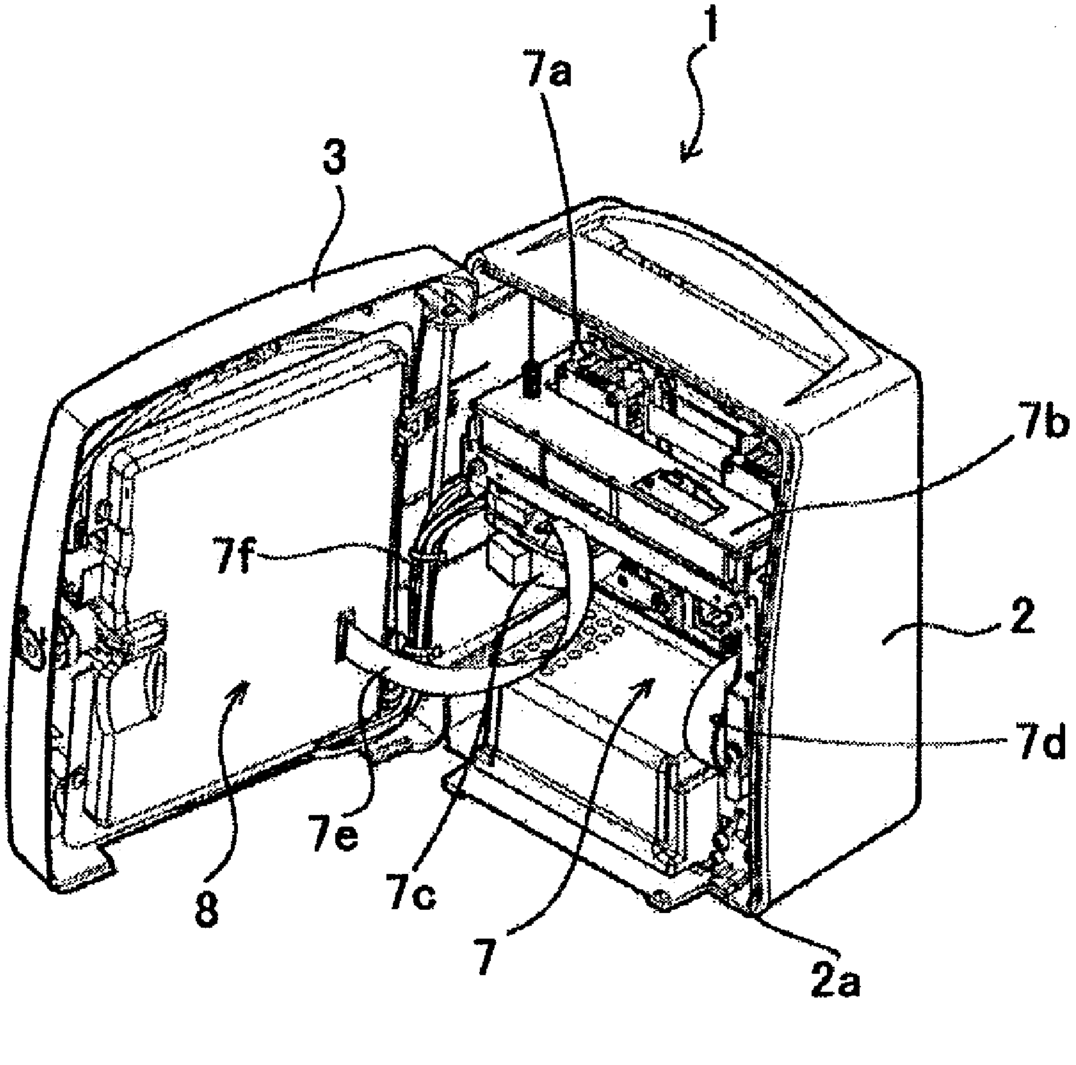
FIG. 6 is a perspective view showing the time recorder in which the door in accordance with the embodiment of the present invention is opened.

As shown in FIG. 6, a mechanical apparatus 7 is installed into the main body 2. The display portion 5 is mounted in the internal face of the door 3, and a control board 8 is attached to the internal face of the door 3. The control board 8 is equipped with a switching board, not shown, pushed by the operation button 6. In this manner, the time recorder is accomplished. The mechanical apparatus 7 includes: a print head 7*a* provided in a carriage; an ink ribbon cassette 7*b;* a motor 7*c* for driving the carriage; a transport mechanism for transporting a time card, not shown; and a motor 7*d* for transporting a time card. The control board 8 is electrically coupled to the motor 7*c*, not shown, for driving the carriage, a driving circuit for the motor 7*d*, and an input terminal or output terminal of a sensor such as a detector for detecting a time card through a signal line 7*e*. The control board 8 controls the motor 7*c*, the driving circuit, and the input terminal or the output terminal. Additionally, the control board 8 is electrically coupled to a power circuit, not shown, which is attached to the inside of the main body 2, through a power cable 7*f.*

Figure 7:
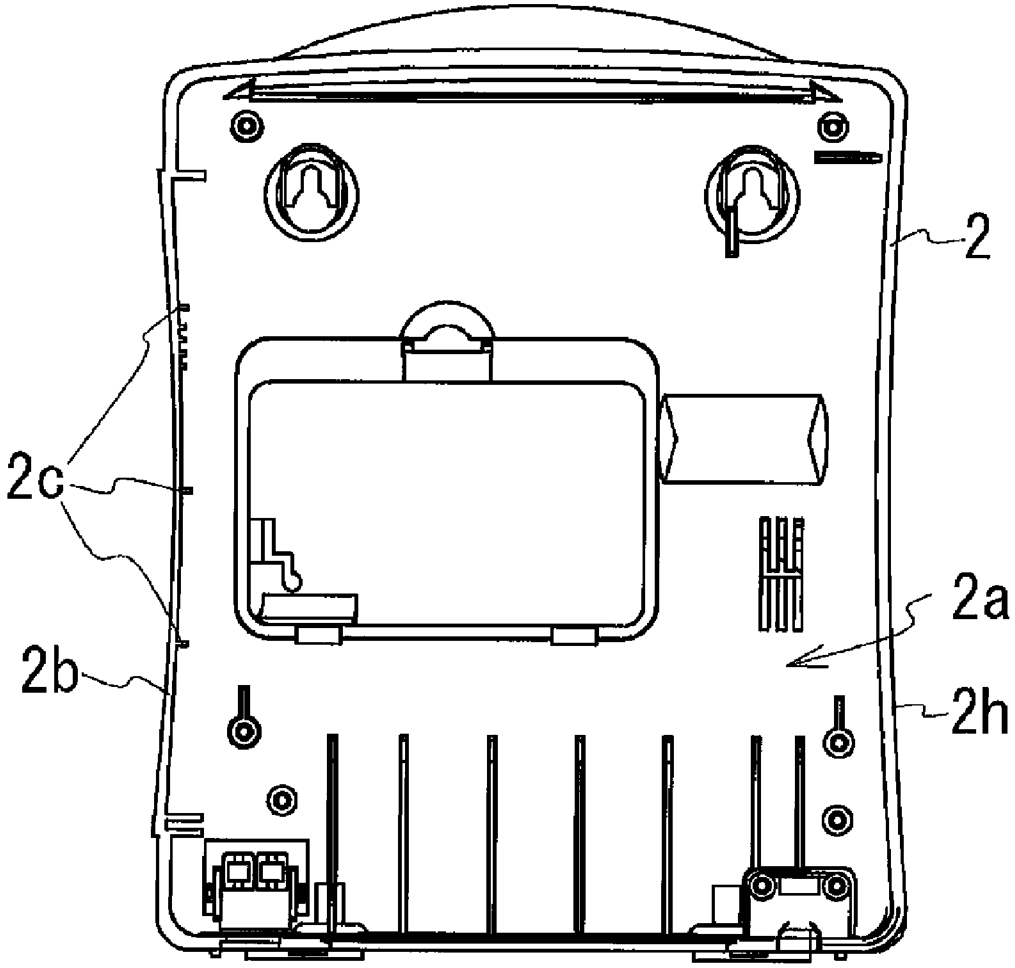
FIG. 7 is a front view showing the main body of the time recorder, in accordance with the embodiment, in which an inward deformation is not corrected.
Figure 8:
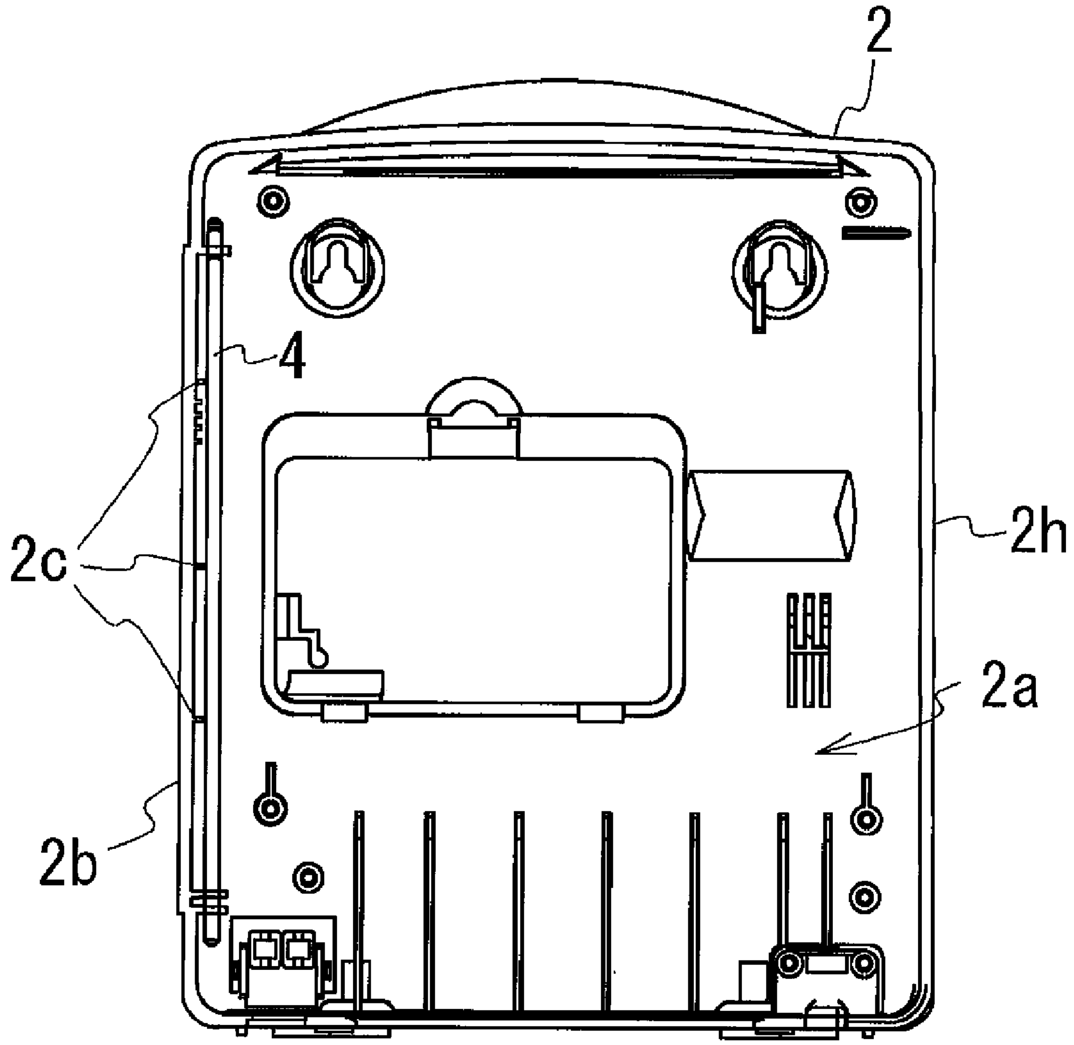
FIG. 8 is a front view showing the main body of the time recorder, in accordance with an embodiment, in which the inward deformation is corrected.

In the case 1 and the time recorder each has such a configuration, the shaft 4 supported by the bearing portions 2*d*, 2*e*, 3*c* and 3*d* is in contact with the ribs 2*c* of the side wall 2*b* of the main body 2. As shown in FIG. 7, an inward deformation occurs in the side walls 2*b* and 2*h* of the main body 2, as closer to the periphery of the opening 2*a* from the back. As shown in FIG. 8, the contact of the shaft 4 with the ribs 2*c* of the side wall 2*b* allows the side wall 2*b* to be biased outward, thereby correcting the inward deformation of the side wall 2*b.*

Moreover, FIG. 8 shows a state in which the inward deformation is corrected. Specifically, when the door 3 is closed, the ribs 3*h* of the side wall 3*g* comes into contact with the inside of the side wall 2*h*, whereby the side wall 2*h* is biased outward.

Further, since the inward deformation increases toward a middle portion of a longitudinal direction, the ribs 2*c* and 3*h* are provided at the appropriate portion and are each spaced at an appropriate interval. The number of the ribs is not limited to three, and an appropriate number of ribs may be provided, according to a range of the inward deformation.

As mentioned heretofore, in the case 1 employed in the time recorder according to an embodiment of the present invention, when the door 3 is attached to the main body 2, the inward deformation of one side wall 2*b* of the main body 2 is corrected, since the shaft 4 serving as the rotatable shaft of the door 3 is in contact with the ribs 2*c* of the side wall 2*b*. Likewise, the inward deformation of another side wall 2*h* of the main body 2 is corrected, since the ribs 3*h* of the side wail 3*g* of the door 3 are in contact with the side wall 2*h*. In this manner, it is no longer necessary to provide, in the case 1, special member for correcting the inward deformation separately, and the inward deformation can be corrected without increasing the number of the part or man-hour.

Finally, several aspects of the present invention are summarized as follows.

According to a first aspect of the present invention, there is provided a case, made of resin, including a main body with an opening and a door closing the opening, and the case includes: a rib integrally formed at inner side of the main body and extending from the opening to a back of the opening; and a shaft member rotatably supported by a bearing integrally formed in the main body, provided at one side of the opening, and serving as a rotatable shaft of the door, wherein the shaft member is in contact with the rib.

Additionally, according to the first aspect of the present invention, the rib may include a plurality of ribs in alignment with an axial direction that the shaft member extends.

According to a second aspect of the present invention, there is provided a time recorder having the case of the first aspect of the present invention.

According to the first aspect and second aspect of the present invention, the inward deformation of the case is corrected, because the axial member, serving as a rotatable shaft of the door, and the rib, provided to extend from the opening to the back of the case, are in contact with each other. Therefore, the inward deformation of the case is corrected without increasing the number of parts and man-hours.

Effect of the Invention

According to the present invention, it is possible to provide a case having a door and a time recorder with the case, so that an inward deformation of the case can be corrected without increasing the number of parts and man-hours.

What is claimed is:

1. A case, made of resin, having a main body with an opening and a door closing the opening, the case comprising:

a side wall provided in the main body;

a rib integrally formed at an inner side of the side wall of the main body and extending from the opening to a back of the opening;

a first bearing and a second bearing integrally formed at the inner side of the side wall of the main body; and a shaft member rotatably supported by the first bearing and the second bearing, provided at one side of the opening, and serving as a rotatable shaft of the door, wherein the rib is provided between the first bearing and the second bearing, and the shaft member is in contact with the rib to correct an inward deformation of the side wall of the main body.

2. The case according to claim 1, wherein the rib includes a plurality of ribs in alignment with an axial direction in which the shaft member extends.

3. A time recorder having a case, made of resin, having a main body with an opening and a door closing the opening, the time recorder comprising:

a side wall provided in the main body;

a rib integrally formed at an inner side of the side wall of the main body and extending from the opening to a back of the opening;

a first bearing and a second bearing integrally formed at the inner side of the side wall of the main body; and a shaft member rotatably supported by the first bearing and the second bearing, provided at one side of the opening, and serving as a rotatable shaft of the door, wherein the rib is provided between the first bearing and the second bearing, and the shaft member is in contact with the rib to correct an inward deformation of the side wall of the main body.

4. A time recorder having a case according to claim 3, wherein the rib includes a plurality of ribs in alignment with an axial direction in which the shaft member extends.

* * * * *